US012767000B2

(12) United States Patent
Yoon et al.

(10) Patent No.: US 12,767,000 B2
(45) Date of Patent: Oct. 20, 2026

(54) BATTERY MANAGEMENT METHOD, VEHICLE EMPLOYING THE METHOD, AND BATTERY

(71) Applicants: Hyundai Motor Company, Seoul (KR); Kia Corporation, Seoul (KR)

(72) Inventors: Joon Keun Yoon, Suwon-Si (KR); Seung Beom Yoon, Hwaseong-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 539 days.

(21) Appl. No.: 18/521,073

(22) Filed: Nov. 28, 2023

(65) Prior Publication Data

US 2024/0383372 A1 Nov. 21, 2024

(30) Foreign Application Priority Data

May 15, 2023 (KR) ........................ 10-2023-0062386

(51) Int. Cl.

*B60L 58/12* (2019.01)
*B60L 58/18* (2019.01)
*G01R 31/3842* (2019.01)
*B60L 3/12* (2006.01)

(52) U.S. Cl.

CPC ............... *B60L 58/12* (2019.02); *B60L 58/18* (2019.02); *G01R 31/3842* (2019.01); *B60L 3/12* (2013.01)

(58) Field of Classification Search

CPC .. B60L 58/12; B60L 58/18; B60L 3/12; B60L 2240/547; B60L 58/10; G01R 31/3842; G01R 31/392; G01R 31/396; G01R 19/10; G01R 19/16576; G01R 31/371; G01R 31/382; Y02E 60/10

See application file for complete search history.

(56) References Cited

U.S. PATENT DOCUMENTS

| | | | | |
|---|---|---|---|---|
| 11,585,862 | B2 * | 2/2023 | Shimonishi | H01M 10/48 |
| 12,681,091 | B2 * | 7/2026 | Lim | G01R 31/367 |
| 2024/0044995 | A1 * | 2/2024 | Bae | G01R 31/3842 |

FOREIGN PATENT DOCUMENTS

| | | |
|---|---|---|
| KR | 10-2022-0018132 | 2/2022 |
| KR | 10-2022-0023527 | 3/2022 |

* cited by examiner

*Primary Examiner* — Seung H Lee

(74) *Attorney, Agent, or Firm* — MORGAN, LEWIS & BOCKIUS LLP

(57) ABSTRACT

A battery management method includes obtaining a voltage-capacity profile in response to charging or discharging of a battery and diagnosing the state of the battery using an $n^{th}$-order differential value (n being a natural number of 1 or greater) at at least one predetermined characteristic point obtained from an $n^{th}$-order differential profile of the voltage-capacity profile.

20 Claims, 12 Drawing Sheets

BATTERY MANAGEMENT METHOD, VEHICLE EMPLOYING THE METHOD, AND BATTERY

CROSS-REFERENCE TO RELATED APPLICATION

The present application claims priority to Korean Patent Application No. 10-2023-0062386, filed on May 15, 2023, the entire contents of which is incorporated herein for all purposes by this reference.

BACKGROUND OF THE PRESENT DISCLOSURE

Field of the Present Disclosure

The present disclosure relates to a battery management method, a vehicle managing a battery according to the method, and a battery.

Description of Related Art

Illustratively, hybrid electric vehicles or electric vehicles include rechargeable batteries.

Because a battery is one of the main energy sources in such a vehicle, it is necessary to manage the battery through continuous monitoring of the state of health (SOH) of the battery as well as the state of charge (SOC) thereof and appropriate actions based on a result of the monitoring.

As one of battery management methods, a related art discloses a battery management method, in which a voltage-state of charge profile with respect to each battery cell is obtained during charging of a battery and is compared with a pre-stored profile, uniformity of the corresponding battery cell is determined based on a result of the comparison, and the battery is managed based on the uniformity.

However, the present conventional method has a disadvantage in that the entire profile needs to be considered, and has a limitation in that utilization thereof is low.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a battery management method, a vehicle employing the method, and a battery that substantially obviate one or more problems due to limitations and disadvantages of the related art.

An object of at least an exemplary embodiment of the present disclosure is to provide a method of managing a battery based on quantitative comparison using quantitative values at a characteristic point in a charging (or discharging) profile of the battery, which indicates the characteristics of the corresponding profile.

Additional advantages, objects, and features of the present disclosure will be set forth in part in the description which follows and in part will become apparent to those having ordinary skill in the art upon examination of the following or may be learned from practice of the present disclosure. The objectives and other advantages of the present disclosure may be realized and attained by the structure particularly pointed out in the written description and claims hereof as well as the appended drawings.

To achieve these objects and other advantages and in accordance with the purpose of the present disclosure, as embodied and broadly described herein, a battery management method includes obtaining a voltage-capacity profile in response to charging or discharging of a battery and diagnosing the state of the battery using an $n^{th}$-order differential value (n being a natural number of 1 or greater) at at least one predetermined characteristic point obtained from an $n^{th}$-order differential profile of the voltage-capacity profile.

In at least an exemplary embodiment of the present disclosure, the obtaining may include obtaining a voltage-capacity profile with respect to each of battery cells included in the battery or with respect to each of battery modules, each of which includes a plurality of battery cells, and the diagnosing may be performed on each of the battery cells or each of the battery modules.

In at least an exemplary embodiment of the present disclosure, the at least one predetermined characteristic point may include an $m^{the}$ peak, an $m^{th}$ valley, or an $m^{th}$ inflection point (m being a natural number of 1 or greater).

In at least an exemplary embodiment of the present disclosure, the battery may include an NCM-based or LFP-based lithium-ion battery, and n may be 2 or greater than 2.

In at least an exemplary embodiment of the present disclosure, the diagnosing may include comparing the $n^{th}$-order differential value with a reference value.

In at least an exemplary embodiment of the present disclosure, the reference value may be a predetermined value.

In at least an exemplary embodiment of the present disclosure, the predetermined value may be a value determined through experiments.

In at least an exemplary embodiment of the present disclosure, the obtaining may include obtaining a voltage-capacity profile with respect to each of battery cells included in the battery or with respect to each of battery modules, each of which includes a plurality of battery cells, the diagnosing may be performed on each of the battery cells or each of the battery modules, and the reference value may be determined based on a statistical value of the $n^{th}$-order differential value obtained with respect to each of the battery cells or each of the battery modules.

In at least an exemplary embodiment of the present disclosure, the obtaining may include obtaining a voltage-capacity profile with respect to each of battery cells included in the battery or with respect to each of battery modules, each of which includes a plurality of battery cells, and the diagnosing may include determining a voltage variation state of the battery cells or the battery modules based on a deviation of the $n^{th}$-order differential value obtained with respect to each of the battery cells or each of the battery modules.

In at least an exemplary embodiment of the present disclosure, determining whether a voltage variation between the battery cells or between the battery modules is equal to or greater than a predetermined value may be further included, and the obtaining and the diagnosing may be performed when the voltage variation is equal to or greater than the predetermined value.

In another aspect of the present disclosure, a vehicle includes a rechargeable battery, an on-board charger configured to charge the battery, and a vehicle control unit configured to receive state information from the battery and to control charging of the battery through the on-board charger, wherein the battery includes at least one monitoring unit configured to detect the state of the battery and a battery management unit configured to receive a detection signal from the at least one monitoring unit and to transmit the state information to the vehicle control unit, wherein the battery management unit includes a memory configured to store control instructions and a processor configured to execute the control instructions, and wherein, by executing the control instructions, the processor is caused to obtain a voltage-capacity profile in response to charging or discharging of the battery and to diagnose the state of the battery using an $n^{th}$-order differential value (n being a natural number of 1 or greater) at at least one predetermined characteristic point obtained from an $n^{th}$-order differential profile of the voltage-capacity profile.

In the vehicle according to at least an exemplary embodiment of the present disclosure, obtaining the voltage-capacity profile may include obtaining a voltage-capacity profile with respect to each of battery cells included in the battery or with respect to each of battery modules, each of which includes a plurality of battery cells, and diagnosing the state of the battery may be performed on each of the battery cells or each of the battery modules.

In the vehicle according to at least an exemplary embodiment of the present disclosure, the at least one predetermined characteristic point may include an $m^{th}$ peak, an $m^{th}$ valley, or an $m^{th}$ inflection point (m being a natural number of 1 or greater).

In the vehicle according to at least an exemplary embodiment of the present disclosure, the battery may include an NCM-based or LFP-based lithium-ion battery, and n may be 2 or greater than 2.

In the vehicle according to at least an exemplary embodiment of the present disclosure, diagnosing the state of the battery may include comparing the $n^{th}$-order differential value with a reference value.

In the vehicle according to at least an exemplary embodiment of the present disclosure, the reference value may be a predetermined value.

In the vehicle according to at least an exemplary embodiment of the present disclosure, the predetermined value may be a value determined through experiments.

In the vehicle according to at least an exemplary embodiment of the present disclosure, obtaining the voltage-capacity profile may include obtaining a voltage-capacity profile with respect to each of battery cells included in the battery or with respect to each of battery modules, each of which includes a plurality of battery cells, and diagnosing the state of the battery may include determining a voltage variation state of the battery cells or the battery modules based on a deviation of the $n^{th}$-order differential value obtained with respect to each of the battery cells or each of the battery modules.

In the vehicle according to at least an exemplary embodiment of the present disclosure, the processor may be further caused to determine whether a voltage variation between the battery cells or between the battery modules is equal to or greater than a predetermined value, and obtaining the voltage-capacity profile and diagnosing the state of the battery may be performed when the voltage variation is equal to or greater than the predetermined value.

In yet another aspect of the present disclosure, a battery includes battery cells, at least one cell monitoring unit configured to detect the state of the battery cells, and a battery management unit configured to receive a detection signal of the battery cells from the at least one cell monitoring unit and to control charging and discharging of the battery cells, wherein the battery management unit includes a memory configured to store control instructions and a processor configured to execute the control instructions, and wherein, by executing the control instructions, the processor is caused to obtain a voltage-capacity profile in response to charging or discharging of each of the battery cells and to diagnose the state of a corresponding battery cell using an $n^{th}$-order differential value (n being a natural number of 1 or greater) at at least one predetermined characteristic point obtained from an $n^{th}$-order differential profile of the voltage-capacity profile.

It is to be understood that both the foregoing general description and the following detailed description of the present disclosure are exemplary and explanatory and are intended to provide further explanation of the present disclosure as claimed.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
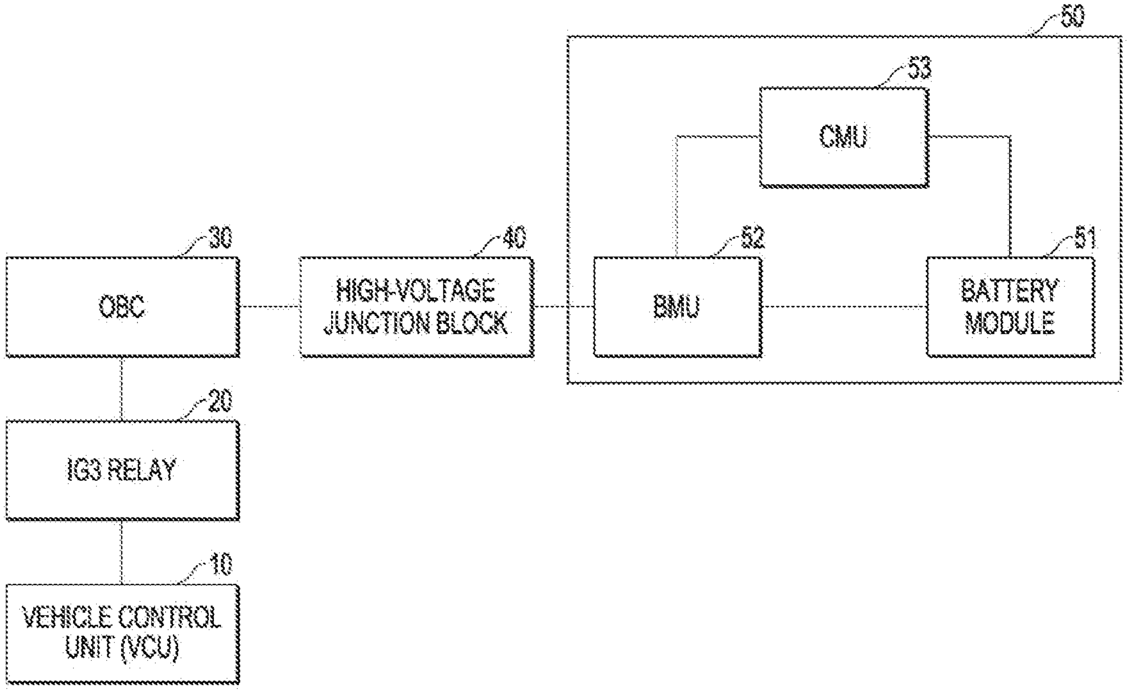
FIG. 1 is a conceptual diagram illustrating components of a battery and a vehicle according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

The present disclosure may make various changes and have various exemplary embodiments of the present disclosure, and specific embodiments are illustrated and described in the drawings. However, this is not intended to limit the present disclosure to a specific embodiment, and should be understood to include all changes, equivalents, or substitutes included in the spirit and technical scope of the present disclosure.

The terms "module" and "unit" used in the present specification are only used for denominative distinction between elements, and should not be construed as presuming that the terms are physically and chemically distinguished or separated or may be distinguished or separated in that way.

Although terms including ordinal numbers, such as "first", "second", etc., may be used herein to describe various elements, the elements are not limited by these terms. The terms may be used only as denominative meanings to distinguish one element from another, and mutual sequential meanings thereof are determined not by names, but by context of the corresponding description.

The term "and/or" is used to include any combination of a plurality of items that are the subject matter. For example, "A and/or B" inclusively means all three cases such as "A", "B", and "A and B".

When an element is referred to as being "coupled" or "connected" to another element, the element may be directly coupled or connected to the other element. However, it should be understood that another element may be present therebetween.

Terms used in the present application are only used to describe specific embodiments, and are not intended to limit the present disclosure. A singular expression includes the plural form unless the context clearly dictates otherwise. in the present specification, it should be understood that a term such as "include" or "have" is intended to designate that the features, numbers, steps, operations, elements, parts, or combinations thereof described in the specification are present, and does not preclude the possibility of addition or presence of one or more other features, numbers, steps, operations, elements, parts, or combinations thereof.

Unless defined otherwise, all terms used herein, including technical or scientific terms, include the same meanings as commonly understood by one of ordinary skill in the art to which the present disclosure belongs. Terms such as those defined in commonly used dictionaries should be interpreted as having meanings consistent with the meanings in the context of the related art, and unless explicitly defined in the present application, the terms should not be interpreted as having ideal or excessively formal meanings.

Furthermore, the term "unit" or "control unit" is merely a widely used term for a controller that is configured to control a specific function, and does not mean a generic functional unit. For example, each unit or control unit may include a communication device for communicating with another controller or a sensor to control a function assigned thereto, a computer-readable recording medium that stores an operating system, a logic command, input/output information, etc., and one or more processors that perform calculation, determination, decision, etc. necessary for controlling a function assigned thereto.

Meanwhile, a processor may include a semiconductor integrated circuit and/or electronic devices that perform at least one of comparison, determination, calculation, and decision to achieve programmed functions. Illustratively, the processor may be any one or a combination of a computer, a microprocessor, a CPU, an ASIC, and an electronic circuit (circuitry or logic circuit).

In addition, a computer-readable recording medium (or simply a memory) includes all types of storage devices in which data readable by a computer system is stored. Illustratively, a computer-readable recording medium may include at least one of memories of flash memory type, hard disk type, micro type, card type (for example, secure digital card (SD card) or extreme Digital Card (XD card)), etc., a random access memory (RAM), a static RAM (SRAM), a read-only memory (ROM), a programmable ROM (PROM), an electrically erasable PROM (EEPROM), a magnetic RAM (MRAM), or memories of magnetic disk and optical disc types.

This recording medium may be electrically connected to the processor, and the processor may read and record data from the recording medium. The recording medium and the processor may be integrated with each other or may be physically separated from each other.

Hereinafter, the accompanying drawings will be described in brief, and embodiments of the present disclosure will be described in detail with reference to the accompanying drawings.

Figure 2:
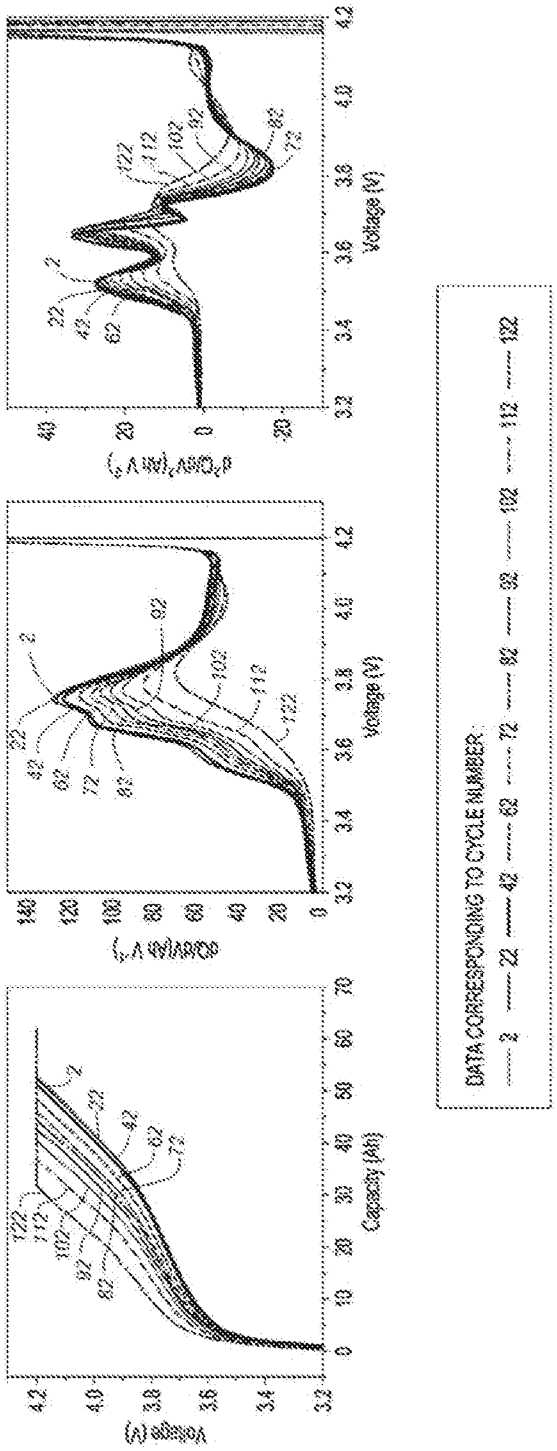
FIG. 2 illustrates a voltage-state of charge profile of the battery, a first-order differential profile thereof, and a second-order differential profile thereof.
Figure 3:
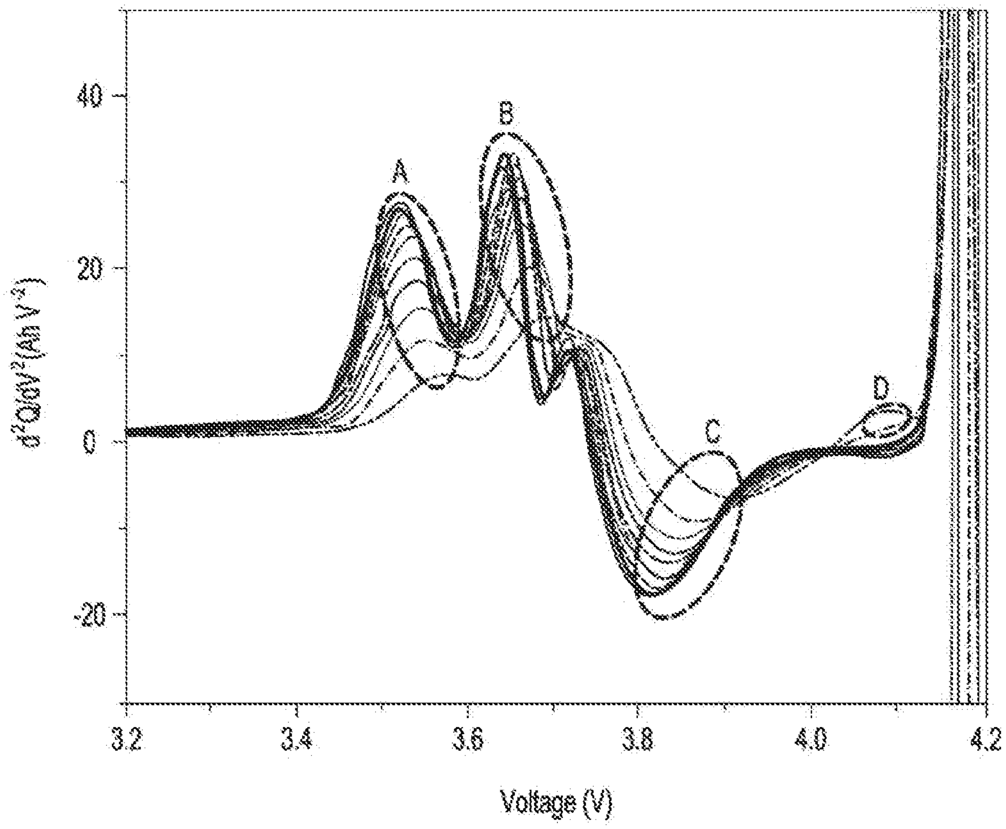
FIG. 3 is a diagram for explaining characteristic points of the second-order differential profile of FIG. 2.
Figure 4:
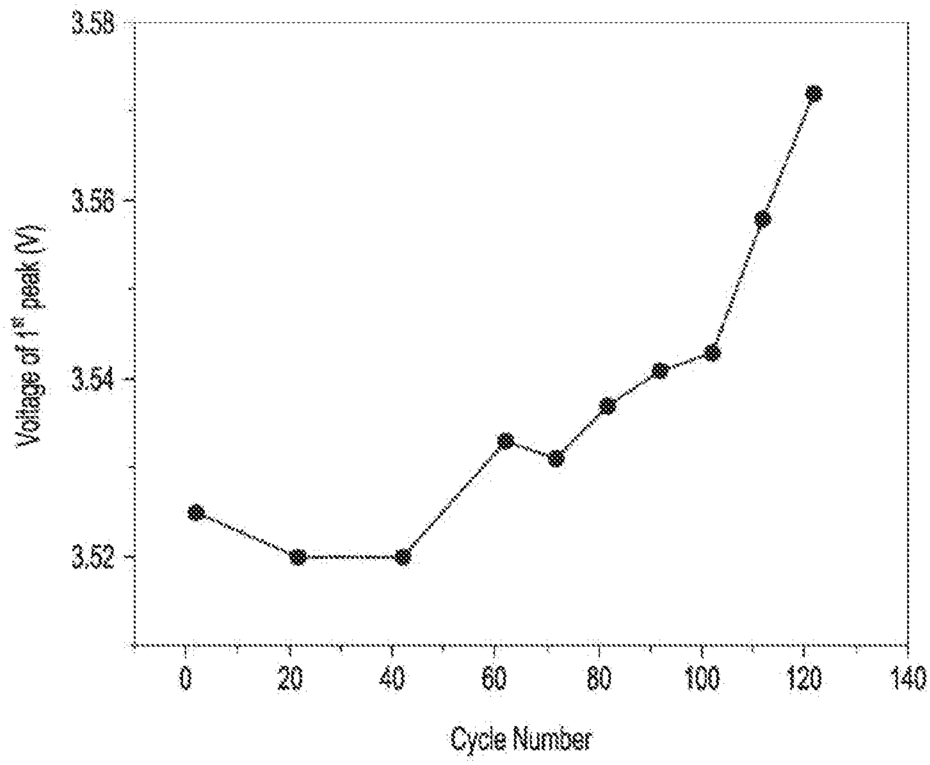
FIG. 4 illustrates a voltage value corresponding to charge-discharge cycle number at a first peak among the characteristic points of FIG. 3.
Figure 5:
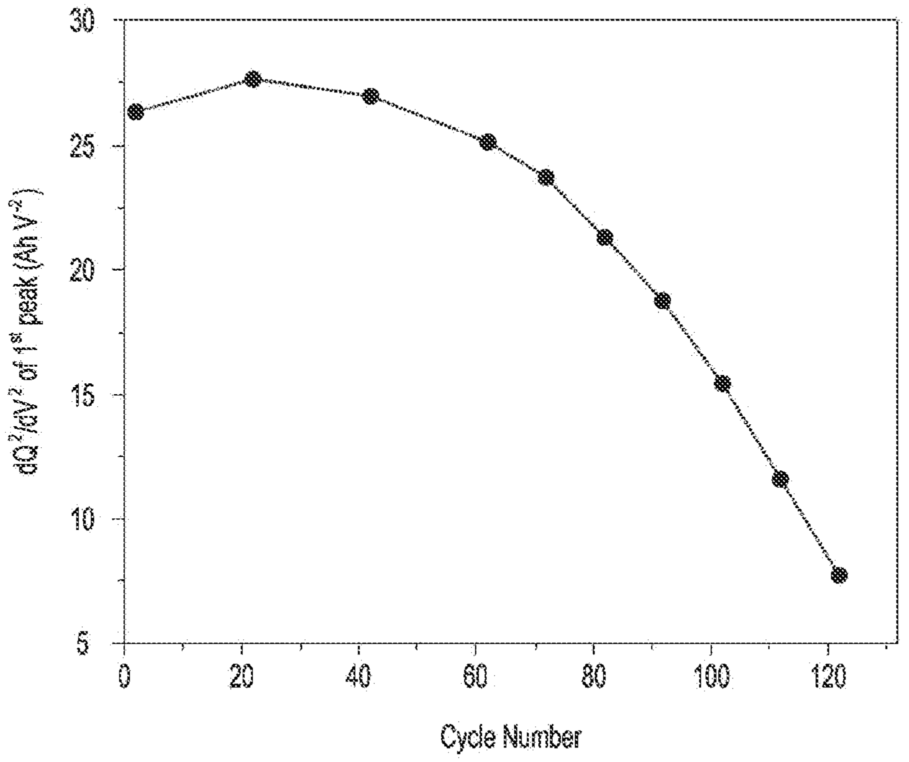
FIG. 5 illustrates a second-order differential value corresponding to charge-discharge cycle number at the first peak among the characteristic points of FIG. 3.

FIG. 1 is a conceptual diagram illustrating components of a battery and a vehicle according to an exemplary embodiment of the present disclosure. FIG. 2 illustrates a voltage-state of charge profile of the battery, a first-order differential profile thereof, and a second-order differential profile thereof. FIG. 3 is a diagram for explaining characteristic points of the second-order differential profile of FIG. 2. FIG. 4 illustrates a voltage value corresponding to charge-discharge cycle number at a first peak among the characteristic points of FIG. 3. FIG. 5 illustrates a second-order differential value corresponding to charge-discharge cycle number at the first peak among the characteristic points of FIG. 3.

Figure 6:
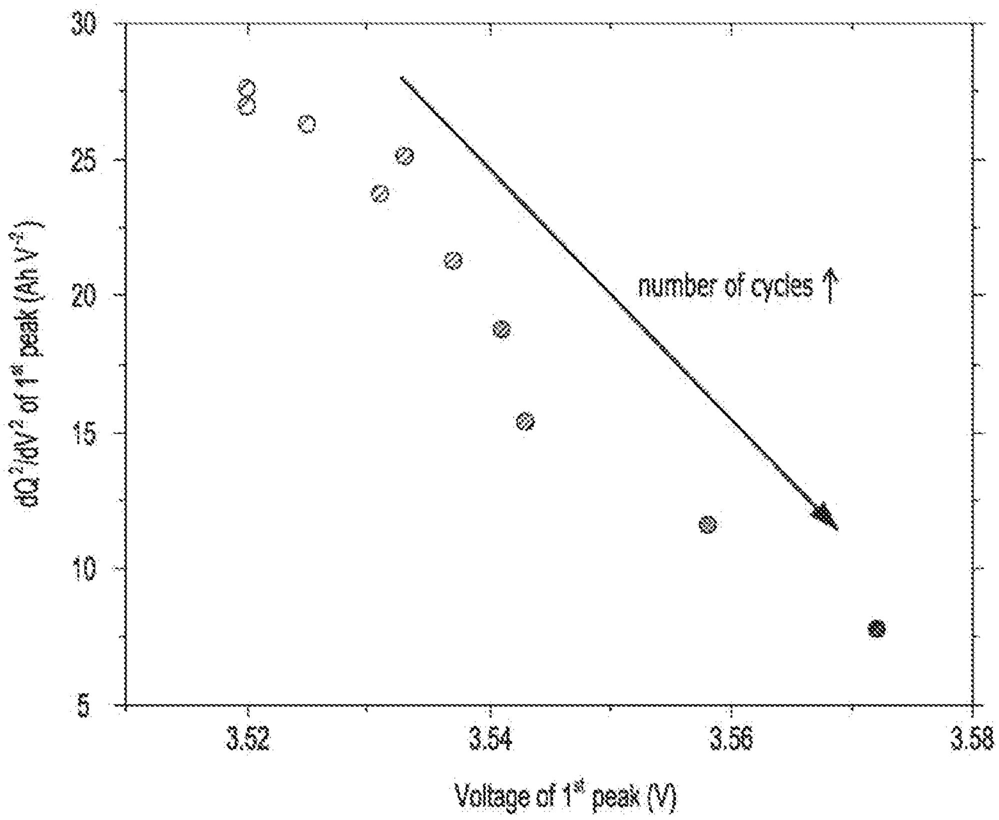
FIG. 6 is a graph in which the horizontal axis represents the voltage value of FIG. 4 and the vertical axis represents the second-order differential value of FIG. 5.

FIG. 6 is a graph in which the horizontal axis represents the voltage value of FIG. 4 and the vertical axis represents the second-order differential value of FIG. 5.

Figure 7:
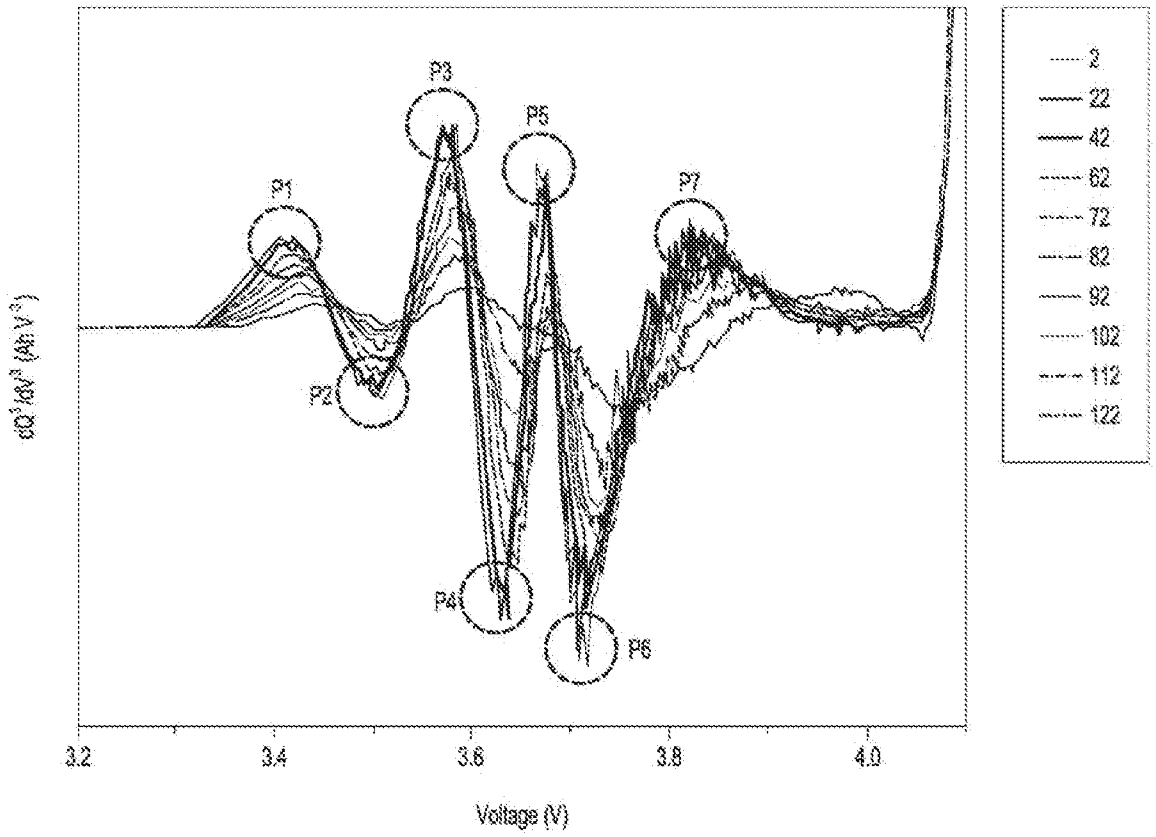
FIG. 7 illustrates a third-order differential profile of the voltage-state of charge profile of FIG. 2.
Figure 8:
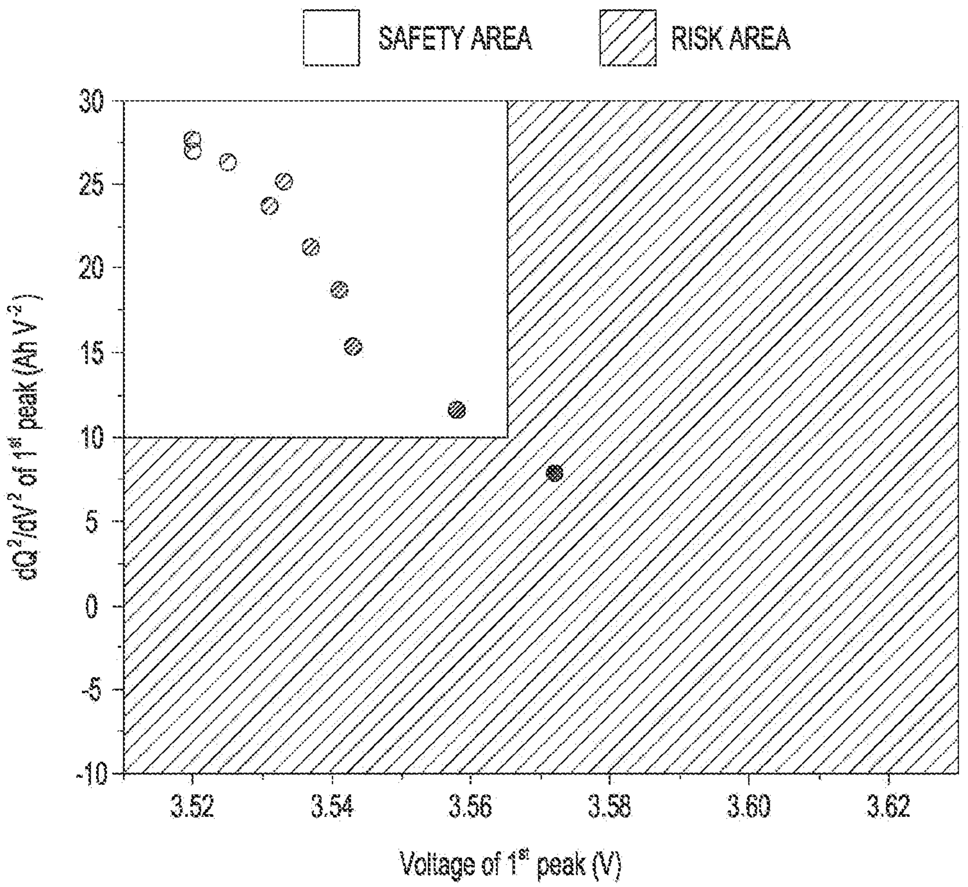
FIG. 8 is a diagram for explaining an example of a method of diagnosing the state of the battery using the graph of FIG. 6.

FIG. 7 illustrates a third-order differential profile of the voltage-state of charge profile of FIG. 2. FIG. 8 is a diagram for explaining an example of a method of diagnosing the state of the battery using the graph of FIG. 6.

Figure 9:
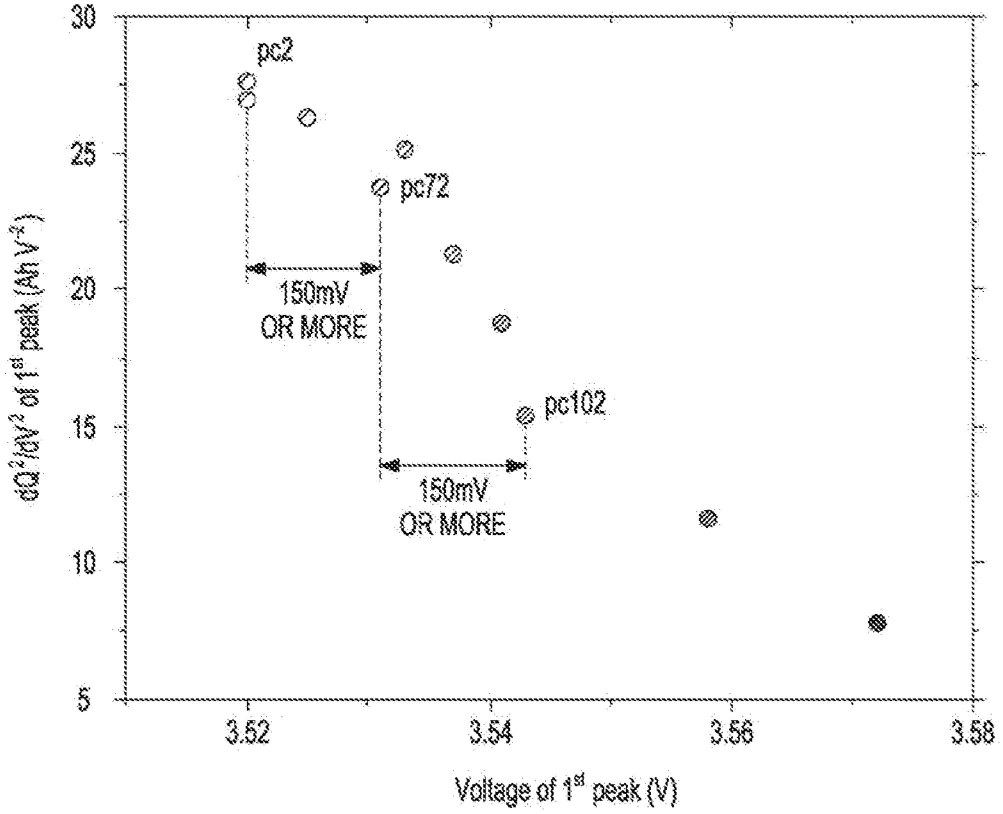
FIG. 9 is a diagram for explaining an example of a method of diagnosing a voltage variation state of battery cells using a deviation of second-order differential values with respect to the battery cells.
Figure 10:
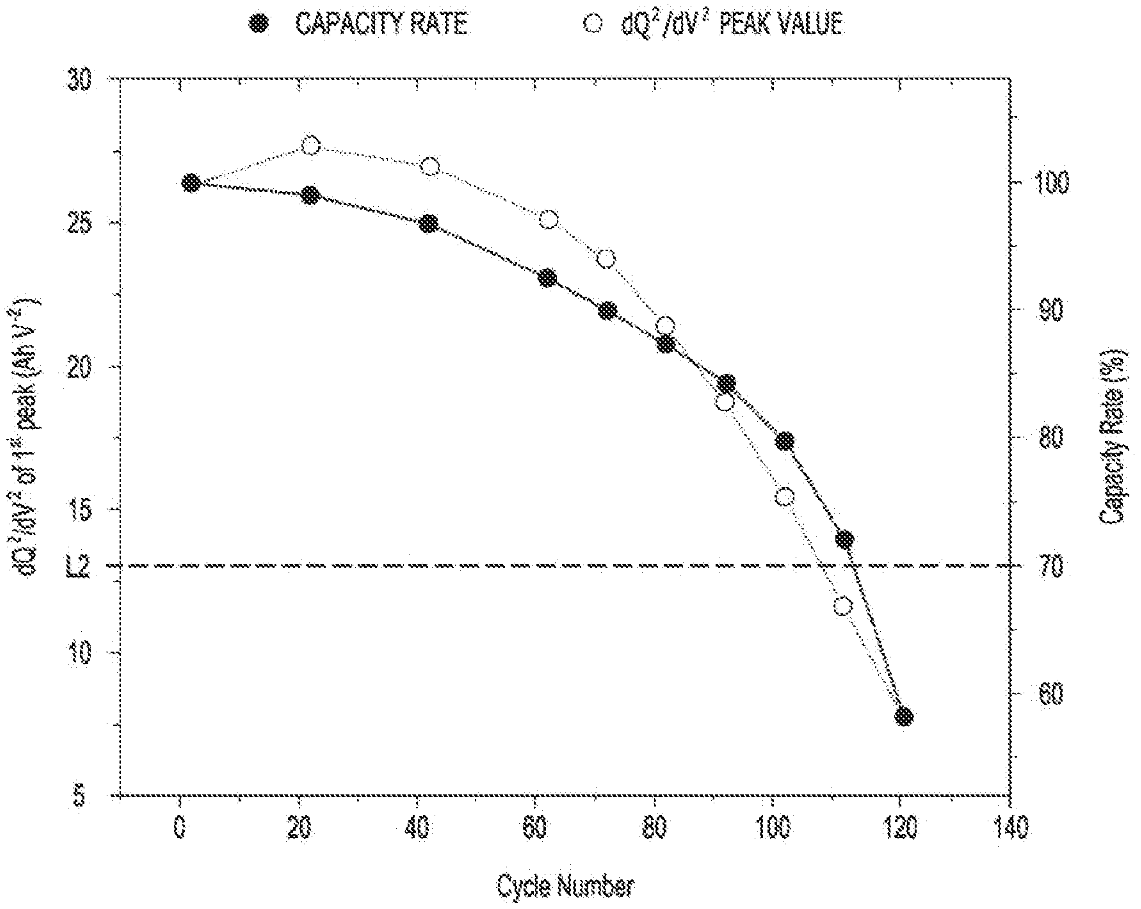
FIG. 10 is a diagram for explaining an example of a method of diagnosing that a battery has reached the guaranteed lifetime using the second-order differential value.

FIG. 9 is a diagram for explaining an example of a method of diagnosing a voltage variation state of battery cells using a deviation of second-order differential values with respect to the battery cells. FIG. 10 is a diagram for explaining an example of a method of diagnosing that a battery has reached the guaranteed lifetime using the second-order differential value.

Figure 11:
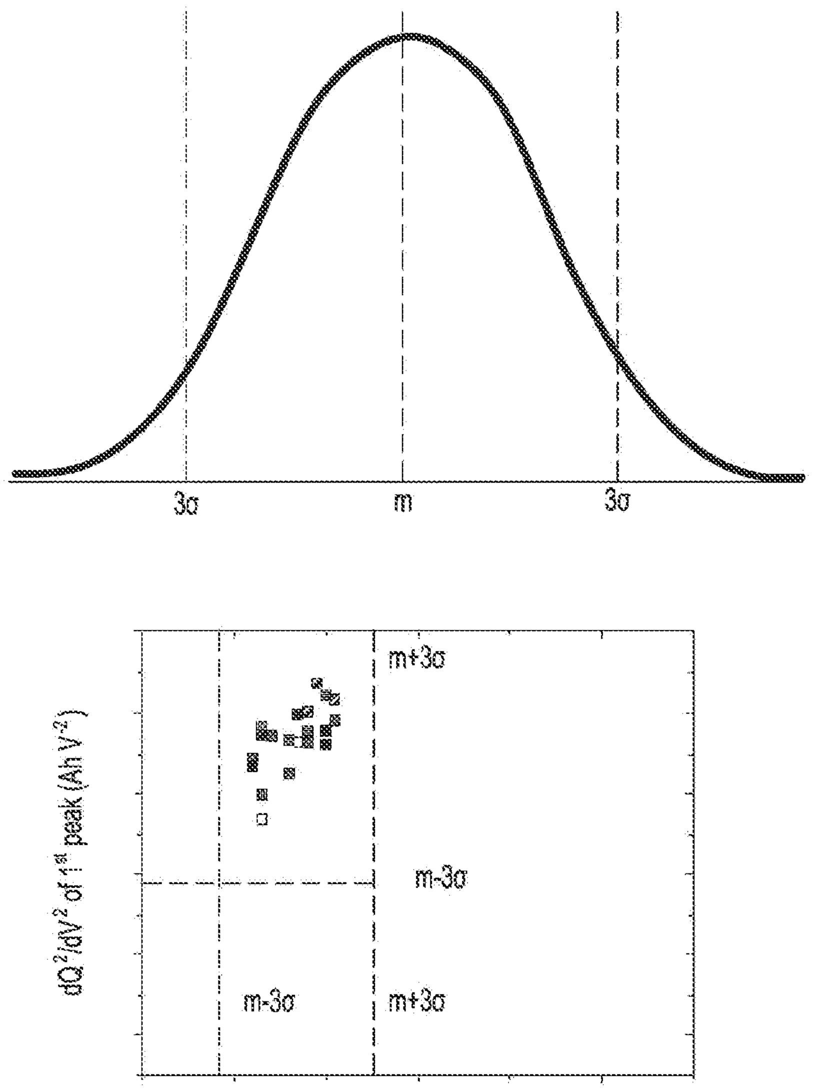
FIG. 11 is a diagram for explaining an example of a method of diagnosing the state of battery cells by performing statistical processing on voltage values and second-order differential values at one characteristic point with respect to the battery cells.
Figure 12:
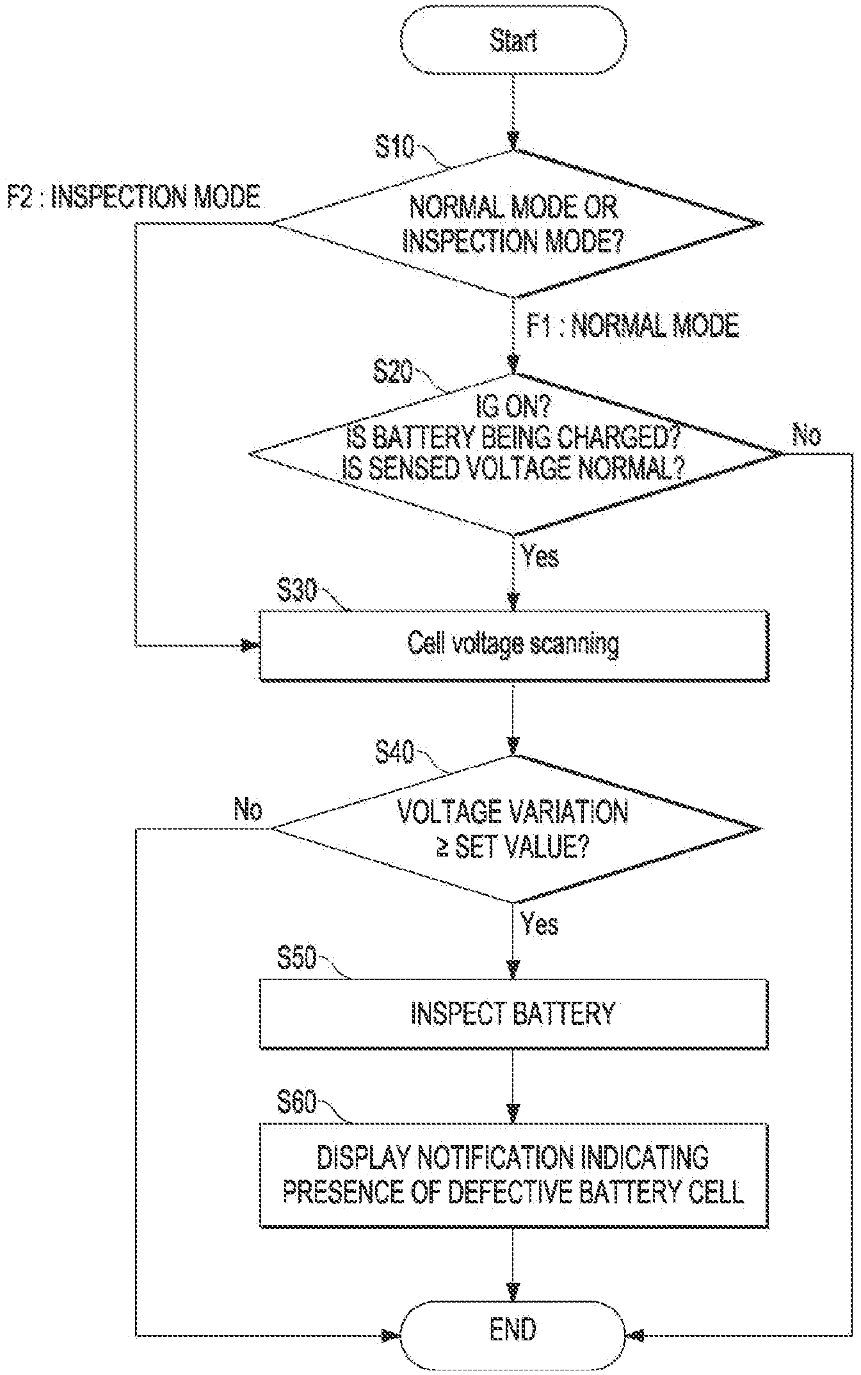
FIG. 12 is a flowchart of battery management performed in a vehicle according to an exemplary embodiment of the present disclosure.

FIG. 11 is a diagram for explaining an example of a method of diagnosing the state of battery cells by performing statistical processing on voltage values and second-order differential values at one characteristic point with respect to the battery cells. FIG. 12 is a flowchart of battery management performed in a vehicle according to an exemplary embodiment of the present disclosure.

As illustrated in FIG. 1, a vehicle according to an exemplary embodiment of the present disclosure includes a vehicle control unit 10, an IG3 relay 20, an on-board charger 30, a high-voltage junction block 40, and a battery 50.

The vehicle control unit 10 is configured to control the IG3 relay 20 and the on-board charger 30 to control charging of the battery 50 or to control discharging of the battery 50 due to use of a driving motor and various electrical components in the vehicle.

Furthermore, the vehicle control unit 10 receives information related to the state of the battery 50 from a battery management unit 52 to be described later, and transmits control instructions for predetermined actions to related components of the vehicle according to the state of the battery 50.

Illustratively, to notify a driver of the abnormal state of the battery 50, a control instruction for visual display of a corresponding notification on an output device including an instrument cluster of the vehicle may be transmitted to the instrument cluster or a controller thereof.

The battery 50 includes a battery module 51, a monitoring unit 53, and a battery management unit 52.

Although only one battery module 51 is shown in the exemplary embodiment of the present disclosure, this is merely for convenience of description, and the present disclosure is not necessarily limited thereto. A plurality of battery modules 51 may be included.

A plurality of battery cells may be provided in a predetermined number and may be connected to each other in series or in parallel to form one battery module 51, and one or more battery modules 51 may be connected in series or in parallel and may be packaged in one battery package so that the battery 50 has a desired output voltage.

The monitoring unit 53 may include a plurality of cell monitoring units 53. Each of the cell monitoring units 53 is configured to determine the amount of current of a corresponding cell to calculate a cell voltage, and transmits the calculated cell voltage to the battery management unit 52.

The cell monitoring unit 53 may be an embedded system which is directly attached to the battery cell to detect a voltage and a current. Unlike the battery management unit 52, the cell monitoring unit 53 is configured only to detect values of a corresponding cell without performing calculation. To the present end, the cell monitoring unit 53 may include an electric circuit configured to detect a voltage and/or a current. In an exemplary embodiment of the present disclosure, the electric circuit may include a sensor configured to detect a voltage and/or a current.

Illustratively, more than ten battery cells are connected to one cell monitoring unit 53, and the cell monitoring unit 53 transmits a detection signal for each cell, i.e., information related to the state of each cell, to the battery management unit 52 through a Controller Area Network (CAN) interface.

The battery management unit 52 may receive information related to the state of all cells from the cell monitoring units 53 and may perform functions necessary for management of the battery 50.

Illustratively, the battery management unit 52 is configured to perform cell balancing to maintain a voltage of each cell constant and thus to ensure the overall performance of the battery and calculates the overall SOC value of the battery 50.

The battery management unit 52 may transmit information related to the overall state of the battery 50 or information related to the state of each battery cell to the vehicle control unit 10. To the present end, the battery management unit 52 may further include one CAN interface.

The battery management unit 52 may include a memory storing control instructions for execution of the functions thereof and at least one processor configured to execute the control instructions.

A battery management method according to an exemplary embodiment of the present disclosure may be implemented by execution of control instructions predetermined for execution of the method. Hereinafter, the battery management method will be described in detail.

First, as described above, FIG. 2 illustrates a voltage-state of charge profile of the battery (a left graph), a first-order differential profile thereof (an intermediate graph), and a second-order differential profile thereof (a right graph).

Although FIG. 2 illustrates a profile of one battery cell, a plurality of battery cells may be grouped into one group and one profile thereof may be obtained. Furthermore, the battery management method to be described later may also be applied to the group of the plurality of battery cells. Furthermore, although FIG. 2 illustrates a profile at the time of charge, a profile at the time of discharge may also be used.

Illustratively, the profiles illustrated in FIG. 2 are profiles obtained when the number of charge-discharge cycles of a provided battery cell is 2, 22, 42, 62, 72, 82, 92, 102, 112, and 122.

The first-order and second-order differential profiles illustrated in FIG. 2 are results obtained through calculation using Equation 1 below from the voltage-state of charge profile indicated by the left graph.

$$\frac{dQ}{dV} \approx \frac{\Delta Q}{\Delta V} = \frac{Q_2 - Q_1}{\Delta V} \quad \text{[Equation 1]}$$

$$\frac{d^2Q}{d^2V} \approx \frac{\Delta[\Delta Q/\Delta V]}{\Delta V}$$

Alternatively, the first-order and second-order differential profiles may be obtained in a hardware manner using a differential circuit, rather than being obtained through the above calculation.

As illustrated in FIG. 2, the first-order differential profile may change in shape due to various factors, such as charging conditions or the SOH of the battery. That is, for example, there may occur a phenomenon that a peak, which is generated for each specific voltage range, becomes gentle or some peaks merge together as the number of charge-discharge cycles increases. This phenomenon may act as an obstacle to quantitative analysis.

On the other hand, it may be seen that the second-order differential profile includes more peaks, valleys, and inflection points and that the aforementioned phenomenon caused in the first-order differential profile occurs less frequently or almost not in the second-order differential profile. This means that the second-order differential profile may be more suitable than the first-order differential profile as an analysis target for battery management.

Peaks, valleys, and inflection points of the profiles may become characteristic points for quantitative comparative analysis, which will be described later. In the case of the first-order differential profile, the positions of the characteristic points may become unclear as the number of charge-discharge cycles increases. However, such a problem hardly occurs or does not occur at all in the second-order differential profile.

Despite increase in the number of cycles, the number of peaks, valleys, and inflection points that are clearly maintained may increase as the order of differentiation increases. For example, FIG. 7 illustrates a third-order differential profile of the voltage-state of charge profile of FIG. 2. It may be seen from FIG. 7 that more peaks and valleys, which may become characteristic points, are included in the third-order differential profile than in the second-order differential profile.

The charging profile changes depending on the material of the battery cell. In the case of a lithium-ion battery, it may be impossible or difficult to find or determine a distinct characteristic point with second-order differentiation depending on a nickel cobalt manganese (NCM) ratio or change of a lithium iron phosphate (LFP) material. In the instant case, third or higher order differentiation may be used.

Referring back to FIG. 3, it may be seen that the second-order differential profile includes first peak points A, second peak points B, and third valley points C and that a new peak point D is generated with increase in the number of charge-discharge cycles.

The peak values at the first peak points A and the second peak points B decrease with increase in the number of cycles, and the valley values at the third valley points C increase with increase in the number of cycles.

Meanwhile, it is revealed that a large amount of lithium is precipitated in the cycle in which the new peak point D is generated, as a result of experiments.

The peak points and the valley points shown in FIG. 3 may become characteristic points that represent the characteristics of the battery cell.

Illustratively, the first peak points shown in FIG. 3 may become characteristic points. FIG. 4 illustrates a voltage value corresponding to the number of cycles at each of the characteristic points, and FIG. 5 illustrates a second-order differential value corresponding to the number of cycles at each of the characteristic points.

FIG. 6 is a graph in which the horizontal axis represents the voltage value of FIG. 4 and the vertical axis represents the second-order differential value of FIG. 5. That is, FIG. 6 is a graph indicating a voltage value and a second-order differential value corresponding to the number of cycles at each of the first peak points of FIG. 3 as the characteristic points.

It may be seen from FIG. 6 that data is plotted along a line inclined in a right-downward direction on the graph as the number of charge-discharge cycles increases.

The x-y coordinates of the data points on the graph of FIG. 6, in which the horizontal axis is the x-axis and the vertical axis is the y-axis, are shown in Table 1 below.

TABLE 1

| Cycle Number | x | y |
|---|---|---|
| 2 | 3.525 | 26.33 |
| 22 | 3.520 | 27.65 |
| 42 | 3.520 | 26.98 |

TABLE 1-continued

| Cycle Number | x | y |
|---|---|---|
| 62 | 3.533 | 25.15 |
| 72 | 3.531 | 23.75 |
| 82 | 3.537 | 21.30 |
| 92 | 3.541 | 18.75 |
| 102 | 3.543 | 15.42 |
| 112 | 3.558 | 11.63 |
| 122 | 3.572 | 7.79 |

This means that it is possible to diagnose the state of the battery cell based on quantitative values at a characteristic point using changes in the voltage value and the differential value corresponding to the number of charge-discharge cycles at the characteristic point.

Illustratively, as illustrated in FIG. 8, a safety area and a risk area may be set on a graph in which the x-axis represents a voltage value and the y-axis represents a second-order differential value, and the state of the battery may be diagnosed using the safety area and the risk area.

For example, while charging is performed, a voltage-state of charge profile with respect to a certain battery cell is obtained, and a second-order differential profile is obtained therefrom. Thereafter, data on a voltage value and a second-order differential value at the first peak point obtained from the profiles is plotted on the graph of FIG. 8, in which the x-axis represents the voltage value and the y-axis represents the second-order differential value. In the instant case, when the x-y coordinate of the data point is within the safety area, it may be diagnosed that the battery is in a safe state, and when the x-y coordinate of the data point is within the risk area, it may be diagnosed that the battery is in a risky state.

Furthermore, it is possible to estimate the SOH of the corresponding battery cell based on the x-y coordinate of the data point.

Meanwhile, voltage variation may occur due to specific factors of hundreds of battery cells in the battery. In the instant case, inspection for voltage variation management may be performed based on a range of, for example, 150 to 200 mV. However, the voltage variation width varies depending on the SOC voltage range. Furthermore, in many cases, it is difficult to make an accurate diagnosis only through voltage monitoring. Therefore, a differential value difference which may be caused when voltage variation occurs within a predetermined range, for example, a range of 150 mV, may be checked, and voltage variation may be managed using the checked differential value difference.

For example, as illustrated in FIG. 9, it is assumed that, in a fully charged state, a voltage difference between when the number of cycles is 2 (pc2) and when the number of cycles is 72 (pc72) is 150 mV or more and a voltage difference between when the number of cycles is 72 (pc72) and when the number of cycles is 102 (pc102) is 150 mV or more.

Under the present assumption, a second-order differential value difference between when the number of cycles is 2 (pc2) and when the number of cycles is 72 (pc72) or a second-order differential value difference between when the number of cycles is 72 (pc72) and when the number of cycles is 102 (pc102) may become an index of occurrence of voltage variation of 150 mV or more between the battery cells.

Furthermore, the indexation of the second-order differential value may be determined differently as the number of cycles increases.

Furthermore, when the maximum charging capacity of the battery is less than the guaranteed capacity, it may be determined that the battery is no longer available. In the instant case, a differential value corresponding to the guaranteed capacity may be checked and used as a reference value, and a determination as to whether the guaranteed limit. i.e., the guaranteed lifetime, has been reached may be made based on the reference value.

Illustratively, as illustrated in FIG. 10, on the assumption that the guaranteed capacity of the battery is 70%, a second-order differential value corresponding thereto may be checked and set as a reference value. The second-order differential value obtained during charging of the battery may be compared with the reference value, and a determination as to whether the guaranteed limit has been reached may be made based on a result of the comparison.

The above diagnosis processes may be performed on all of the battery cells of the battery described above, and accordingly, the state of each of the battery cells may be diagnosed.

FIG. 12 is a flowchart of a battery diagnosis process applicable to the vehicle of FIG. 1. The battery diagnosis process will be described below with reference to FIG. 12.

First, a battery inspection mode may be divided into a normal mode and an inspection mode.

The normal mode is a mode other than the inspection mode. For example, the inspection mode may be commenced in response to a specific event or user selection.

If the current mode is determined to be the normal mode in step S10, the process enters an "F1" mode. If the current mode is determined to be the inspection mode in step S10, the process enters an "F2" mode.

In the case of the normal mode, in step S20, a determination as to whether a vehicle is in an ignition (IG) ON state, whether the battery is being charged, or whether the detected voltage of the battery is in a normal range is made.

If "YES" in step S20, the voltages of the battery cells are detected through the cell monitoring units in step S30.

Subsequently, in step S40, a determination as to whether voltage variation between the battery cells is equal to or greater than a predetermined value is made.

If the voltage variation is equal to or greater than the predetermined value, battery inspection is performed in step S50. At least one of the above-described battery diagnosis processes may be executed to inspect the battery.

When it is determined that there is a defective battery cell based on a result of the inspection of the battery, a notification indicating the presence of a defective battery cell is displayed on an output device including the instrument cluster or the like in step S60, providing information related to the state of the battery to a user.

If "NO" in step S20 or if "NO" in step S40, the battery inspection in step S50 is not performed.

If the current mode is determined to be the inspection mode in step S10, the process directly proceeds to step S30.

Meanwhile, a battery diagnosis method using a characteristic point in a differential profile of a charging profile with respect to a battery may also be used for quality control in a battery production process, which will be described in detail with reference to FIG. 11.

For example, when 1,000 battery cells are produced, coordinate values based on voltage values and differential values at characteristic points in a differential profile of a charging profile with respect to each cell may be obtained and statistically analyzed.

As illustrated in a statistical graph for normal distribution of FIG. 11 (an upper graph), assuming that the average value of the x-y coordinates with respect to 1,000 cells is m and the standard deviation thereof is $\sigma$ and that quality control is performed based on a range of $3\sigma$, x-y coordinate values falling in the range of $3\sigma$ are obtained, and an upper limit and a lower limit are set thereamong, as illustrated in a lower graph of FIG. 11.

Once the upper limit and the lower limit are determined in the present way, the quality of a battery cell may be evaluated based on a coordinate value at a characteristic point obtained during charging of the corresponding battery cell.

The above-described battery diagnosis method using statistical processing may also be used to select recyclable battery cells in waste batteries.

As is apparent from the above description, according to at least an exemplary embodiment of the present disclosure, it is possible to diagnose and manage a battery based on quantitative comparison using quantitative values at a characteristic point in a differential profile of a charging (or discharging) profile of the battery.

Furthermore, the term related to a control device such as "controller", "control apparatus", "control unit", "control device", "control module", or "server", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present disclosure. The control device according to exemplary embodiments of the present disclosure may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may be configured to process data according to a program provided from the memory, and may be configured to generate a control signal according to the processing result.

The control device may be at least one microprocessor operated by a predetermined program which may include a series of commands for carrying out the method included in the aforementioned various exemplary embodiments of the present disclosure.

The aforementioned invention can also be embodied as computer readable codes on a computer readable recording medium. The computer readable recording medium is any data storage device that can store data which may be thereafter read by a computer system and store and execute program instructions which may be thereafter read by a computer system. Examples of the computer readable recording medium include Hard Disk Drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet). Examples of the program instruction include machine language code such as those generated by a compiler, as well as high-level language code which may be executed by a computer using an interpreter or the like.

In various exemplary embodiments of the present disclosure, each operation described above may be performed by a control device, and the control device may be configured by a plurality of control devices, or an integrated single control device.

In various exemplary embodiments of the present disclosure, the memory and the processor may be provided as one chip, or provided as separate chips.

In various exemplary embodiments of the present disclosure, the scope of the present disclosure includes software or machine-executable commands (e.g., an operating system, an application, firmware, a program, etc.) for enabling operations according to the methods of various embodiments to be executed on an apparatus or a computer, a non-transitory computer-readable medium including such software or commands stored thereon and executable on the apparatus or the computer.

In various exemplary embodiments of the present disclosure, the control device may be implemented in a form of hardware or software, or may be implemented in a combination of hardware and software.

Furthermore, the terms such as "unit", "module", etc. included in the specification mean units for processing at least one function or operation, which may be implemented by hardware, software, or a combination thereof.

In an exemplary embodiment of the present disclosure, the vehicle may be referred to as being based on a concept including various means of transportation. In some cases, the vehicle may be interpreted as being based on a concept including not only various means of land transportation, such as cars, motorcycles, trucks, and buses, that drive on roads but also various means of transportation such as airplanes, drones, ships, etc.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The term "and/or" may include a combination of a plurality of related listed items or any of a plurality of related listed items. For example, "A and/or B" includes all three cases such as "A", "B", and "A and B".

In the present specification, unless stated otherwise, a singular expression includes a plural expression unless the context clearly indicates otherwise.

In exemplary embodiments of the present disclosure, "at least one of A and B" may refer to "at least one of A or B" or "at least one of combinations of at least one of A and B". Furthermore, "one or more of A and B" may refer to "one or more of A or B" or "one or more of combinations of one or more of A and B".

In the exemplary embodiment of the present disclosure, it should be understood that a term such as "include" or "have" is directed to designate that the features, numbers, steps, operations, elements, parts, or combinations thereof described in the specification are present, and does not preclude the possibility of addition or presence of one or more other features, numbers, steps, operations, elements, parts, or combinations thereof.

According to an exemplary embodiment of the present disclosure, components may be combined with each other to be implemented as one, or some components may be omitted.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A method of managing a battery including at least one monitoring unit configured to detect a state of the battery and a battery management unit configured to receive a detection signal from the at least one monitoring unit and transmit information related to the state to outside and including a memory storing control instructions and a processor executing the control instructions, the method comprising:

obtaining, by the processor, a voltage-capacity profile in response to charging or discharging of the battery; and diagnosing, by the processor, the state of the battery using an $n^{th}$-order differential value at at least one predetermined characteristic point obtained from an $n^{th}$-order differential profile of the voltage-capacity profile, wherein the n is a natural number of 1 or greater than 1.

2. The method of claim 1, wherein the obtaining includes obtaining the voltage-capacity profile with respect to each of battery cells included in the battery or with respect to each of battery modules, each battery module including a plurality of battery cells, and wherein the diagnosing is performed on each of the battery cells or each of the battery modules.

3. The method of claim 1, wherein the at least one predetermined characteristic point includes an $m^{th}$ peak, an $m^{th}$ valley, or an $m^{th}$ inflection point, the m being a natural number of 1 or greater than 1.

4. The method of claim 1, wherein the battery includes an NCM-based or LFP-based lithium-ion battery, and the n is 2 or greater than 2.

5. The method of claim 1, wherein the diagnosing includes comparing the $n^{th}$-order differential value with a reference value.

6. The method of claim 5, wherein the reference value is a predetermined value.

7. The method of claim 6, wherein the predetermined value is a value determined through experiments.

8. The method of claim 5, wherein the obtaining includes obtaining the voltage-capacity profile with respect to each of battery cells included in the battery or with respect to each of battery modules, each battery module including a plurality of battery cells, wherein the diagnosing is performed on each of the battery cells or each of the battery modules, and wherein the reference value is determined based on a statistical value of the $n^{th}$-order differential value obtained with respect to each of the battery cells or each of the battery modules.

9. The method of claim 1, wherein the obtaining includes obtaining the voltage-capacity profile with respect to each of battery cells included in the battery or with respect to each of battery modules, each battery module including a plurality of battery cells, and wherein the diagnosing includes determining a voltage variation state of the battery cells or the battery modules based on a deviation of the $n^{th}$-order differential value obtained with respect to each of the battery cells or each of the battery modules.

10. The method of claim 9, further including:

determining, by the processor, whether a voltage variation between the battery cells or between the battery modules is equal to or greater than a predetermined value, wherein the obtaining and the diagnosing are performed in response that the voltage variation is equal to or greater than the predetermined value.

11. A vehicle comprising:

a rechargeable battery;

an on-board charger configured to charge the battery; and a vehicle control unit configured to receive state information from the battery and to control charging of the battery through the on-board charger, wherein the battery includes:

at least one monitoring unit configured to detect a state of the battery; and a battery management unit configured to receive a detection signal from the at least one monitoring unit and to transmit the state information to the vehicle control unit, wherein the battery management unit includes a memory configured to store control instructions and a processor configured to execute the control instructions, and wherein, by executing the control instructions, the processor is configured to:

obtain a voltage-capacity profile in response to the charging or a discharging of the battery; and diagnose the state of the battery using an $n^{th}$-order differential value at at least one predetermined characteristic point obtained from an $n^{th}$-order differential profile of the voltage-capacity profile, wherein the n is a natural number of 1 or greater than 1.

12. The vehicle of claim 11, wherein to obtain the voltage-capacity profile, the processor is further configured to obtain the voltage-capacity profile with respect to each of battery cells included in the battery or with respect to each of battery modules, each battery module including a plurality of battery cells, and wherein the processor is further configured to diagnose the state of the battery on each of the battery cells or each of the battery modules.

13. The vehicle of claim 11, wherein the at least one predetermined characteristic point includes an $m^{th}$ peak, an $m^{th}$ valley, or an $m^{th}$ inflection point, the m being a natural number of 1 or greater than 1.

14. The vehicle of claim 11, wherein the battery includes an NCM-based or LFP-based lithium-ion battery, and the n is 2 or greater than 2.

15. The vehicle of claim 11, wherein to diagnose the state of the battery, the processor is further configured to compare the $n^{th}$-order differential value with a reference value.

16. The vehicle of claim 15, wherein the reference value is a predetermined value.

17. The vehicle of claim 16, wherein the predetermined value is a value determined through experiments.

18. The vehicle of claim 11, wherein to obtain the voltage-capacity profile, the processor is further configured to obtain the voltage-capacity profile with respect to each of battery cells included in the battery or with respect to each of battery modules, each battery module including a plurality of battery cells, and wherein to diagnose the state of the battery, the processor is further configured to determine a voltage variation state of the battery cells or the battery modules based on a deviation of the $n^{th}$-order differential value obtained with respect to each of the battery cells or each of the battery modules.

19. The vehicle of claim 18, wherein the processor is further configured to determine whether a voltage variation between the battery cells or between the battery modules is equal to or greater than a predetermined value, and wherein the processor is configured to obtain the voltage-capacity profile and diagnose the state of the battery in response that the voltage variation is equal to or greater than the predetermined value.

20. A battery comprising:

battery cells;

at least one cell monitoring unit configured to detect a state of the battery cells; and a battery management unit configured to receive a detection signal of the battery cells from the at least one cell monitoring unit and to control charging and discharging of the battery cells, wherein the battery management unit includes a memory configured to store control instructions and a processor configured to execute the control instructions, and wherein, by executing the control instructions, the processor is configured to:

obtain a voltage-capacity profile in response to the charging or the discharging of each of the battery cells; and diagnose a state of a corresponding battery cell using an $n^{th}$-order differential value at at least one predetermined characteristic point obtained from an $n^{th}$-order differential profile of the voltage-capacity profile, wherein the n is a natural number of 1 or greater than 1.

* * * * *